United States Patent [19]

Dougherty et al.

[11] 4,174,236
[45] Nov. 13, 1979

[54] METHODS OF AND APPARATUS FOR CONTROLLING CAPACITANCE UNBALANCE-TO-GROUND IN CABLES

[75] Inventors: Timothy S. Dougherty, Roswell; William M. Flegal, Tucker, both of Ga.

[73] Assignee: Western Electric Company, Inc., New York, N.Y.

[21] Appl. No.: 829,362

[22] Filed: Aug. 31, 1977

[51] Int. Cl.² .................. B29D 27/00; B29F 3/10
[52] U.S. Cl. ................................ 156/51; 264/40.7; 324/61 R; 425/140; 425/148; 174/110 F; 174/113 R
[58] Field of Search .............. 156/50, 51; 324/61 R, 324/54; 425/71, 113, 140, 141, 145, 148; 264/40.2, 40.7

[56] References Cited

U.S. PATENT DOCUMENTS

| 3,914,357 | 10/1975 | Cereijo et al. | 264/40 |
| 3,973,187 | 8/1976 | Cereijo et al. | 324/61 R |
| 4,017,228 | 4/1977 | Cereijo et al. | 425/71 |

OTHER PUBLICATIONS

A. S. Windeler, "PE-Insulated Telephone Cable," Wire and Cable Symposium, Dec. 7, 1955.
F. W. Horn, "ABC of the Telephone Cable, Inside and Out," vol. 5, 1974, Lee's ABC of the Telephone.
J. A. Olszewski, "Capacitance Relationships in Filled Telephone Cables and Equilibrium Prediction from Water Immersion Tests," pp. 399–407, Proceedings of 24th International Wire and Cable Symposium.

Primary Examiner—John T. Goolkasian
Assistant Examiner—William H. Thrower
Attorney, Agent, or Firm—E. W. Somers

[57] ABSTRACT

Capacitance unbalance-to-ground between conductors of a twisted pair, each of which may be insulated with at least a layer of cellular plastic insulation, is maintained within acceptable limits by controlling the extrusion of the insulation to maintain the measured coaxial capacitance and associated outside diameter of the insulated conductors within a range of values which correspond to acceptable capacitance unbalance-to-ground values.

8 Claims, 8 Drawing Figures

METHODS OF AND APPARATUS FOR CONTROLLING CAPACITANCE UNBALANCE-TO-GROUND IN CABLES

BACKGROUND OF THE INVENTION

1. Field of the Invention

This invention relates to the control of capacitance unbalance-to-ground in cables and, more particularly, to methods of and apparatus for the control of capacitance unbalance-to-ground of twisted conductor pairs in cables having conductors covered with at least a layer of cellular insulation by controlling the insulating of the conductors.

2. Prior Art

It is now common practice to fill the interstices among a plurality of twisted pairs of solid-plastic insulated conductors which comprise a core of a multipair telephone cable with a waterproofing compound to prevent the ingress of water which affects the electrical characteristics of the cable. Since the replacement of the air in the interstices with waterproofing compound results in poorer insulating properties, the amount of insulation about each conductor must be increased to retain the insulating properties of unfilled cable. This results in an increase in cross-sectional area of each of the insulated conductors, as well as that of the core, thereby requiring additional plastic compound to form a jacket about the core, all of which represents increased cost of manufacture. In order to realize the advantages of filled cable and, at the same time, to maintain the cost comparable to that of unfilled cable by reducing the size of the insulated conductors, individual conductors are insulated with a cellular plastic which may be covered with an outer skin of a solid abrasion-resistant plastic material. Because cellular plastic has a lower dielectric constant and hence, better insulating properties than solid plastic, a reduced wall thickness of cellular plastic insulation may be used with the result that the total thickness of the cellular plastic insulation plus the skin layer of solid plastic is equivalent to that for solid plastic insulation in an unfilled, air-core cable.

Although cellular plastic insulation is well known in the art, problems occur in the control of parameters, such as, for example, coaxial capacitance and outside diameter, of the insulated conductor, which are indicative of the quality of the insulated conductors. Coaxial capacitance is defined as the capacitance between the conductor and a probe which are separated by the insulation. Lack of control of the amount of expansion which is a parameter not generally encountered in solid plastic insulation can result in random variations in the dielectric constant of the cellular insulation. Random variations in the dielectric constant affects capacitance-to-ground, which is a cable characteristic is defined as the grounded capacitance of one insulated conductor of a twisted pair and is a measure of the quality of the conductor in its ability to resist the pick-up of energy from external sources, such as, for example, power transmission lines. See, for example, Horn, Y. W., "*ABC of the Telephone Cable, Inside and Out*", Vol. 5, 1974 Lee's ABC of the Telephone.

After the conductors are insulated with the cellular insulation, they are twisted together in pairs and subsequently formed into a cable. In order to be acceptable, twisted pairs of conductors must exhibit a difference or unbalance in capacitance-to-ground which is less than a predetermined value. Test results show that while the two conductors of any pair may each have acceptable coaxial capacitance and outside diameter values, when twisted together, the pair has unacceptable capacitance unbalance-to-ground values. It has been thought that if measured values of coaxial capacitance and outside diameter of each insulated conductor of a pair fell within acceptable limits, the capacitance unbalance-to-ground would also be acceptable. See Windeler, A. J., *Polyethylene Insulated Telephone Cable*, 4th Annual Wire and Cable Symposium, Dec. 7, 1955. This seeming anomaly may be overcome by twisting conductors having equal capacitance-to-ground values; however, this requires costly shop control.

SUMMARY OF THE INVENTION

The problem of being able to maintain the capacitance unbalance-to-ground value of a pair of insulated conductors at less than a predetermined value has been solved by the present invention wherein the application of insulation to conductors is monitored to control the capacitance unbalance-to-ground of each insulated conductor relative to a conductor having preselected values of coaxial capacitance and outside diameter to make it fall within a predetermined range of values.

A method embodying the principles of the invention includes the steps of covering conductors with a plastic insulation material to form insulated conductors, measuring the coaxial capacitance and associated outside diameter of the insulated conductors, generating electrical signals which correspond to the measured capacitance and associated diameter of each of the insulated conductors, and relating these signals to the capacitance unbalance-to-ground between each of said conductors and a reference insulated conductor having preselected values of coaxial capacitance and outside diameter, and controlling the covering of the conductors to maintain the capacitance unbalance-to-ground value between each said conductor and the reference conductor within a predetermined range. In one embodiment, the generated signals of coaxial capacitance and outside diameter are displayed on a coordinate trace of a continuous recorder with lines of constant percent expansion and constant difference in capacitance-to-ground between insulated conductors and the reference conductor superimposed thereon and related to the values of coaxial capacitance and outside diameter. It has been found that if conductors which are insulated with coordinate values of coaxial capacitance and outside diameter falling within a defined portion of the trace having a predetermined range of capacitance unbalance-to-ground values relative to the reference conductor are twisted together, the capacitance unbalance-to-ground value of the pair is acceptable.

An apparatus for controlling capacitance unbalance-to-ground between conductors of a pair includes facilities for extruding cellular insulation over conductors to form insulated conductors, facilities for measuring capacitance and associated outside diameter of the insulated conductors, facilities for displaying measured capacitance and associated diameter with respect to corresponding lines of constant percent expansion and a region defined by spaced lines of constant capacitance unbalance-to-ground values, and facilities for generating a continuous indication of the measured capacitance and associated diameter of the conductors on the displaying facilities, and facilities for controlling at least the percent expansion of the cellular insulation to maintain the coordinate values of coaxial capacitance and diameter within the defined region. In one embodiment, the apparatus also includes facilities for twisting together conductors having an insulation identified by capacitance and diameter values falling within the defined region of the trace.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION

Figure 1:
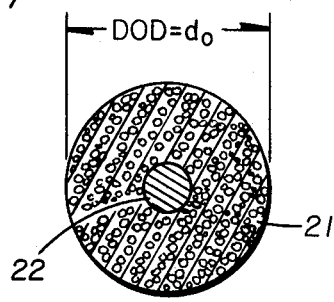
FIG. 1 is a view of a conductive element having a single layer of cellular plastic insulation extruded thereabout.
Figure 2:
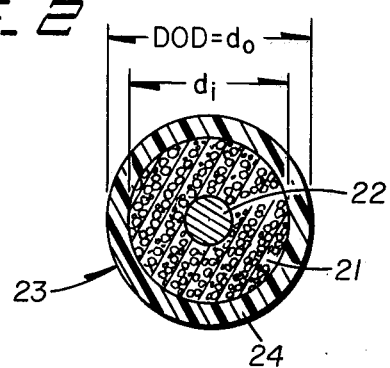
FIG. 2 is a view of a conductive element insulated with an inner layer of cellular plastic insulation and an outer skin layer of solid plastic insulation.

A cellular plastic insulation 21 (see FIG. 1) for covering a conductor 22, typically copper or aluminum wire ranging from 16 to 45 mils in diameter (see FIG. 1) is well known and is formed from a solid plastic material containing an admixed expanding medium which is extruded about the conductor. Referring now to FIG. 2, there is shown a dual insulated conductor 23 which includes the conductive element 22 having the cellular insulation 21 and a concentric layer 24 of solid plastic insulation thereabout. The outer layer 24 is comprised, for example, of polyvinyl chloride (PVC) or polyethylene, which forms a thin outer skin 24 that imparts tough mechanical properties to the insulation, that possesses improved voltage breakdown characteristics, and that provides a suitable material for color coding as well as reducing the permeability of the insulation to a filling compound if used. The outside diameter of the insulated conductor 23 varies between 30 and 80 mils while the wall thickness of the outer layer 24 ranges between 2 and 5 mils.

Figure 3:
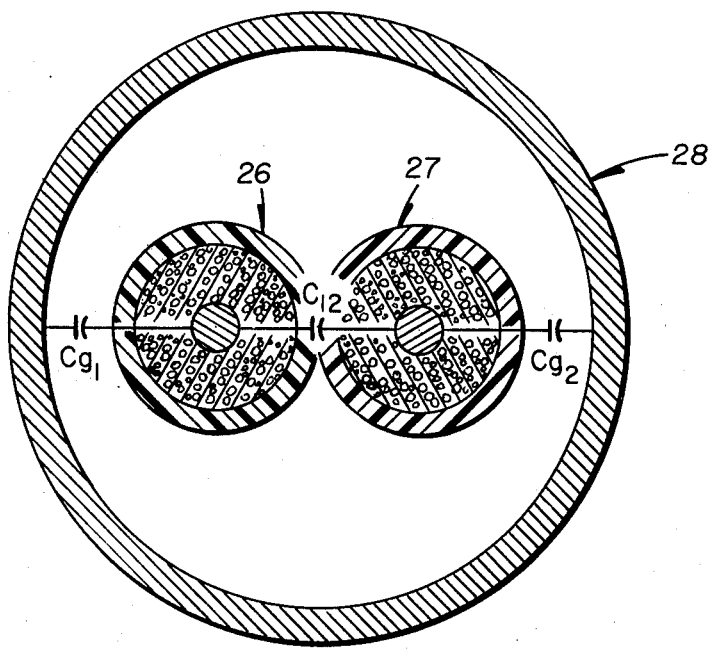
FIG. 3 is a cross-section view of a twisted insulated conductor pair within a shielded cable and illustrating in schematic form how capacitance values for the insulated conductors are measured.

Referring now to FIG. 3, there is shown in schematic a view of two insulated conductors 26 and 27 enclosed in a cable shield 28 for purposes of illustrating capacitance measurements. In order to conduct a test for the conductor 26, all the other conductors (not shown) in the cable including the conductor 27 which is twisted together with the conductor 26 are grounded and the capacitance-to-ground of the conductor 26 is measured and designated $Cg_1$. The capacitance-to-ground of a conductor 27, $Cg_2$, is measured in a similar manner and the difference $(Cg_1-Cg_2)$ calculated. This difference which is designated as the capacitance unbalance-to-ground is a cable characteristic. Direct capacitance between the two conductors 26 and 27 is designated $C_{12}$ and is added to the parallel combination of $Cg_1$ and $Cg_2$ to obtain a characteristic referred to as mutual capacitance. The capacitance-to-ground characteristic of an insulated conductor is a function of the thickness of the insulation, of the dielectric constant and of the distance of the conductor to the shield. Since, as disclosed by the priorly identified Windeler article, *Polyethylene Insulated Cable*, the dielectric constant of insulation decreases as the percent voids increases, the capacitance-to-ground value of cellular insulated conductors also varies.

It should be understood that the term "cellular insulation" includes not only that formed from a solid plastic containing an admixed expanding medium, but also some types of solid insulation, e.g. high density polyethylene (HDPE), where contraction voids occur, generally adjacent to the conductor 22. While the methods and apparatus of this invention will be described with respect to controlling capacitance-to-ground unbalance in expanded cellular insulation, it should be understood that they are equally applicable to a conductor 22 insulated with a solid plastic insulation which may for example, develop contraction voids and hence acts as an expanded celular insulation.

Figure 4:
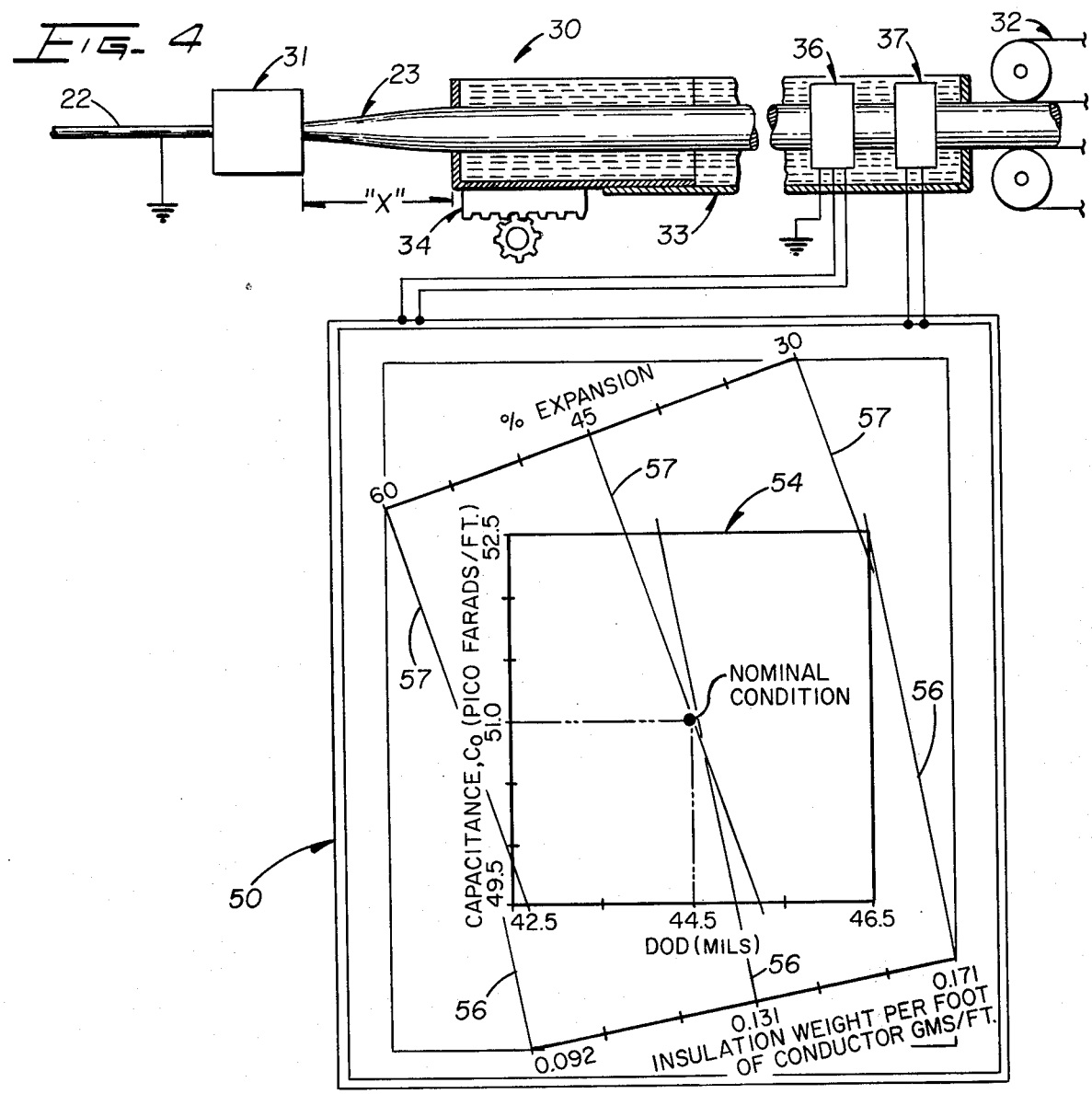
FIG. 4 is a view of an apparatus partially in section and in elevation and partially in schematic embodying the principles of this invention for covering the conductive element with cellular plastic insulation together with facilities for monitoring the covering.

The insulation 21 may be extruded about the conductor 22 by an apparatus designated generally by the numeral 30, such as that shown in FIG. 4. The following description of the methods and apparatus of this invention will assume that the conductor 23 is being covered with either cellular plastic material 21 or with dual insulating layers 24 and 21 comprising a solid plastic over expanded polyethylene, for example. It should be understood that term "plastic" is intended to include both thermoplastic and thermosetting materials including rubber and rubber-like materials.

The conductor 22 is advanced by a capstan 32 through an extruder 31 where the insulation 21 or the dual insulation layers 21 and 24 are applied by a die (not shown) which may be that disclosed and claimed in U.S. Pat. Nos. 3,947,173 and 3,903,233 issued Mar. 30, 1976 and Sept. 2, 1975 respectively, in the name of T. S. Dougherty. Then the insulated conductor 23 is advanced out of the extruder 31 and after a predetermined amount of travel through an air-gap distance designated "x", is moved into a cooling trough 33. As can be seen in FIG. 4, the cooling trough 33 is mounted on a gear and rack mechanism 34 for movement reciprocally longitudinally of the path of travel of the conductor 23 so that the air-gap may be adjusted to control the percent expansion of the cellular layer 21.

Two in-line measurements of the dual insulated conductor 26 are made near the downstream end of the cooling trough 33. A capacitance monitor 36 measures the coaxial capacitance of the insulation 21 or of the insulation layers 21 and 24 covering the conductive element 22. The capacitance monitor 36 may be of the type shown in U.S. Pat. Nos. 2,765,441 or 2,908,861 issued on Oct. 2, 1956 and Oct. 13, 1959, respectively, in the name of R. D. Gambrill or that shown in U.S. Pat. No. 2,804,592. The overall diameter $d_o$, or diameter-over-dielectric and hereinafter referred to as DOD, (see FIGS. 1 and 2) of the insulated conductor 23 is monitored continuously by a gauge 37, such as, for example, an underwater diameter gauge that is manufactured by the Beta Instrument Company and designated model no. TG1000 or TI500. Typical traces of the overall capacitance $C_o$ and the DOD are recorded on a strip chart (not shown).

In order to provide a meaningful display of process variables, a coordinate chart-recording instrument 50 (see FIG. 4) of the type which is available commercially from the Hewlett-Packard Company, under the description, Model No. 7004B, is used. The instrument 50 has a continuous recorder printer (not shown) which is moved up and down by a current signal from the capacitance monitor 36 and from side to side by a current signal from the DOD gauge 37. A chart 53 is inserted into the instrument 50 for each reel (not shown) of the insulated conductor 23 such that changes in coaxial capacitance and DOD indicated by the position of the recorder printer (not shown) are in direct correspondence with the incremental changes in coaxial capacitance and DOD indicated by the respective monitoring instruments 36 and 37. Superimposed upon the chart 53 is an operating window or target area 54 which represents acceptable values of coaxial capacitance and DOD for the insulated conductor 23.

Although it is desirable to use cellular insulation in filled cables, there are problems peculiar to cellular insulation which must be overcome. While the use of solid plastic insulation to cover the conductor 22 requires an operator to look only at a trace of DOD or coaxial capacitance, and to adjust only one parameter, such as, for example, extruder screw speed or line speed, additional parameters must be taken into account in dealing with cellular plastic insulation. In order to maintain a coaxial capacitance-DOD trace for cellular plastic insulation within the operating window 54, the trace must be made with respect to product parameters which may be changed by known process parameters. As disclosed in U.S. Pat. Nos. 3,914,357, 3,973,187 and 4,017,228 issued on Oct. 21, 1975, Aug. 3, 1976 and Apr. 12, 1977, respectively, in the names of M. R. Cereijo and T. S. Dougherty it has been determined that two product parameters related to coaxial capacitance and DOD which may be used for this purpose are weight of insulation per unit length of the conductor 23 and the percent expansion. It should be understood that "percent expansion" or percent voids is interpreted to mean the percent of the cross sectional area which is comprised of voids.

The weight of insulation per unit length of dual expanded plastic insulation, the dielectric constants for single layer cellular insulation and for dual insulated conductors, and the percent expansion may be calculated from equations set forth in priorly identified U.S. Pat. Nos. 3,914,357, 3,973,187 and 4,017,228. From these equations, values of coaxial capacitance and DOD may be calculated for weight of insulation and for percent expansion and parallel lines 56—56 of constant weight of insulation, expressed in grams-per-foot, for example, of the conductor 23, and parallel lines 57—57 of constant percent expansion are superimposed on the operating window 54. The display of FIG. 4 depicts constant output and constant percent expansion lines superimposed on and in mathematical relationship to a plot of coaxial capacitance versus DOD for cellular plastic insulation.

Typically, the coaxial capacitance $C_o$ and the DOD (see FIGS. 1 and 2) of an insulated conductor are monitored with a continuous indication thereof being conveniently displayed. The display is made in such a way that there is a continuous indication not only of coaxial capacitance and DOD, but also of percent expansion and weight of insulation per foot of the conductor 23. By using the principles of the hereinbefore-identified Cereijo-Dougherty patents, guides are provided so that an operator viewing the trace on the composite recorder instrument 50 may make those adjustments required for correction.

It should be realized that the output of the extruder 31 for the skin layer 24, if used, does not affect the output for the inner cellular layer 21 and that the thickness of the outer layer 24 is essentially constant. When using the present invention for dual insulation, solid plastic over cellular plastic, it is assumed that the skin thickness $(d_o-d_i)/2$ is constant and known and may be measured off-line or by a separate in-line monitor. Also the composite dielectric constant of the plastic insulation material may be determined, and the total weight includes the weight of the cellular insulation together with the weight of the solid insulation. From instrumentation on the line, the overall coaxial capacitance of the dual insulation and the DOD of the successive sections of the dual insulated conductor 23 are measured.

Figure 5:
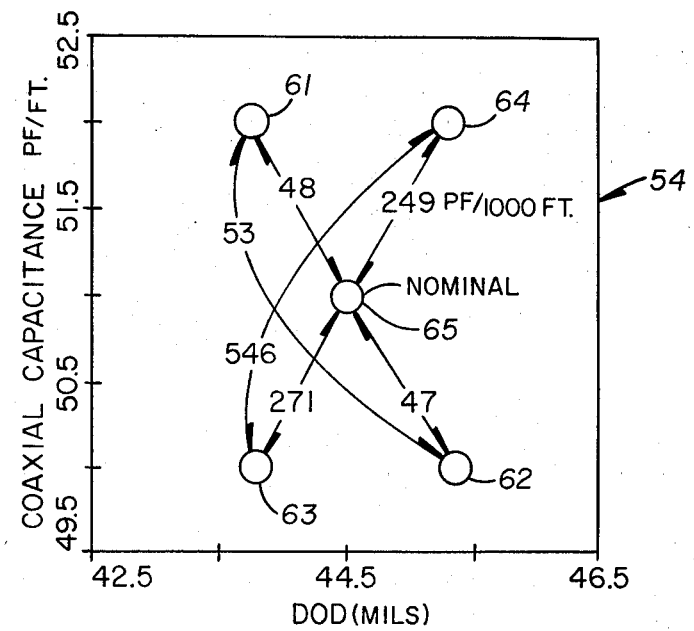
FIG. 5 is a graph of coaxial capacitance versus outside diamter with coordinate values for five insulated conductors thereon and showing corresponding capacitance unbalance-to-ground values between each one of four of the conductors and a fifth conductor having nominal properties.

Referring now to FIG. 5, there are shown coordinate values of coaxial capacitance and DOD for several example conductors 61–65 and, superimposed thereon, the values of capacitance-to-ground differences when two of the conductors, as indicated by a line therebetween, are twisted together. If the conductors 61 and 65 or 61 and 62 which are at the upper left and center or at the upper left and lower right hand corners, respectively, of the graph, are twisted together, the capacitance-to-ground differences are 48 and 53 pf/1000 ft. However, if the conductors 63 and 64, which have coordinate values at the upper right and lower left corners of the display, the difference in capacitance-to-ground is significantly higher, i.e. 546 pf/1000 ft. The higher capacitance-to-ground unbalance, which causes interference between conductors and adjacent power lines as well as crosstalk loss of pairs at presently used carrier frequencies, occurs notwithstanding the acceptable coaxial capacitance and DOD values of each of the conductors 63 and 64 falling within the operating window 54.

It has been stated in the prior art that in order to insure that two insulated conductors of a pair have nearly equal capacitance to the surrounding pairs and to its shield, the cylinders of insulation on the two conductors of a pair must be alike in size and dielectric constant. It has also been stated that coaxial capacitance and capacitance-to-ground in a cable are not the same but are related in a linear fashion and that control of one is effectively a control of the other. As should be apparent from the discussion hereinbefore and especially from a study of FIG. 5, the control of coaxial capacitance of each conductor of a pair does not necessarily result in the control of capacitance unbalance-to-ground values of the pair.

The determination of the capacitance unbalance-to-ground values between insulated conductors 23—23 may be made graphically. It has been found that the capacitance unbalance-to-ground between an insulated conductor 23 manufactured as described hereinbefore and a reference insulated conductor 65 having nominal values of coaxial capacitance and DOD may be calculated from the following equation:

$$Cub = A(DOD - DOD_o) + B(Cc - Cc_o)$$

where
  Cub=capacitance unbalance-to-ground,
  A and B are constants which may be determined by a regression analysis from experimental data,
  DOD=diameter-over-dielectric of an insulated conductor,
  $DOD_o$=diameter-over-dielectric of reference insulated conductor at nominal condition,
  Cc=coaxial capacitance of the insulated conductor; and
  $Cc_o$=coaxial capacitance of reference insulated conductor at nominal condition.

Figure 6:
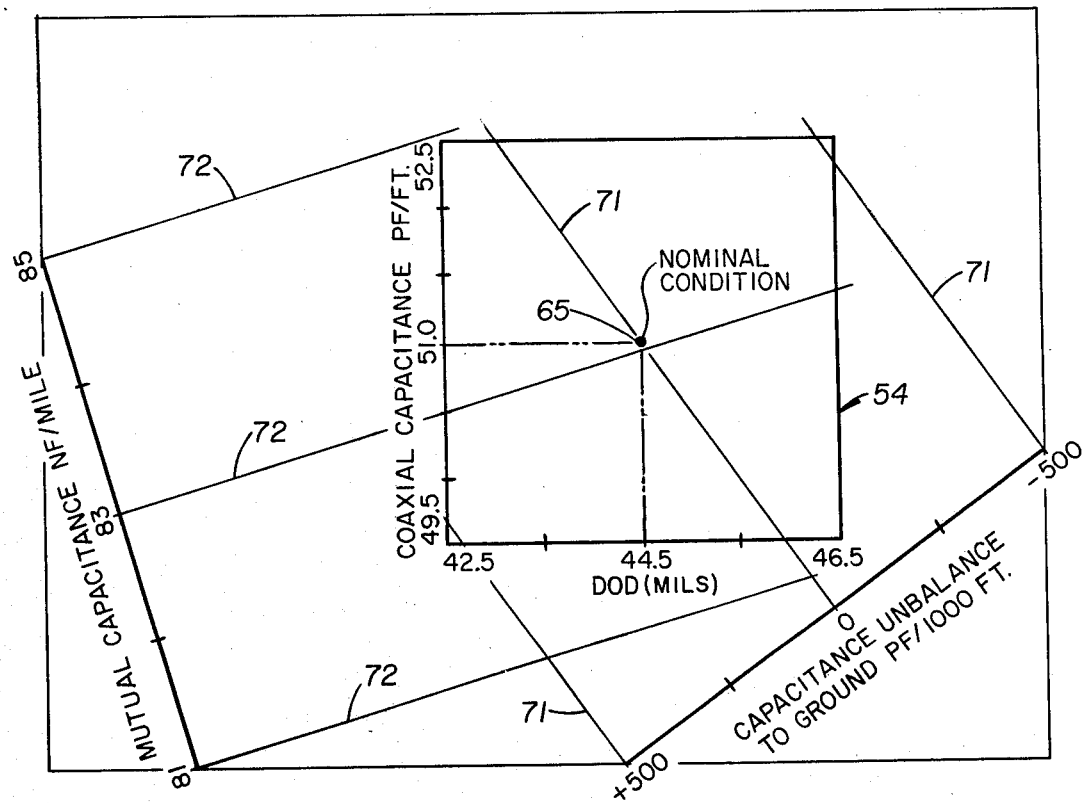
FIG. 6 is a graph of coaxial capacitance versus outside diameter of insulated conductors with lines of constant capacitance unbalance-to-ground and constant mutual capacitance superimposed thereon and related mathematically to the coaxial capacitance and outside diameter.

The above equation is used to plot a family of curves of constant capacitance unbalance-to-ground values as between an insulated conductor 23 and the reference insulated conductor 65 on a display of coaxial capacitance versus DOD, which may be, for example, linear and shown as lines 71—71 (see FIG. 6).

The difference in capacitance-to-ground of two insulated conductors which are to be twisted together is obtained by subtracting algebraically the values of the capacitance unbalance-to-ground lines 71—71 or interpolated values between the lines on which the coordinate values of coaxial capacitance and DOD fall. For example, the capacitance unbalance-to-ground between a twisted pair comprising an insulated conductor having coaxial capacitance and DOD values which fall along the line 71 having a scale value of −500 pf/1000 ft. in FIG. 6 and an insulated conductor 65 having nominal values is −500 pf/1000 ft. A twisted pair of conductors 23—23 each having coordinate values of coaxial capacitance and DOD located along the same one of the lines 71—71 have a zero difference or zero capacitance unbalance-to-ground value. From the drawings and the foregoing equation for Cub, it should be obvious that the unbalance between any conductor lying along the line 71 having a scale value of −500 pf/1000 feet and any conductor lying along the line 71 through the nominal condition at 65 will have an unbalance value of −500 pf/1000 feet.

For each conductor pair represented by coordinate values of coaxial capacitance and DOD, empirically derived equations may be used to calculate mutual capacitance. A curve fitting procedure is used to form a family of curves of constant mutual capacitance which in FIG. 6 are shown as a family of straight lines 72—72. Two insulated conductors 23—23 having coaxial capacitance and DOD values which fall along the same one of the lines 72—72 have a mutual capacitance therebetween of the value indicated on the scale to the left in FIG. 6.

Figure 7:
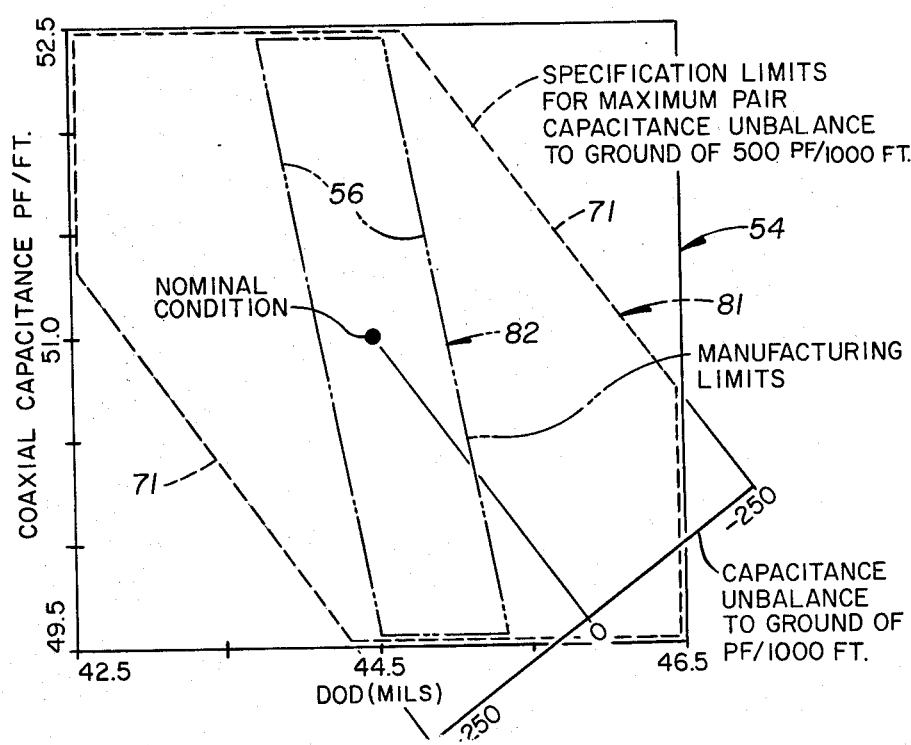
FIG. 7 is a graph of coaxial capacitance versus outside diameter of insulated conductors with two different operating windows superimposed thereon.

In the preferred approach for minimizing the difference in capacitance-to-ground values, which embodies the principles of this invention, the graph is provided with an operating window 81 which is defined laterally, as viewed in FIG. 7, by two spaced lines 71—71 of constant capacitance unbalance-to-ground values. The lateral boundaries are selected so that if the two insulated 23—23 conductors which are twisted together have coaxial capacitance-DOD coordinate values which fall on the boundary lines, the resulting capacitance unbalance-to-ground of the twisted pair is acceptable. The upper and lower boundaries of the operating window 81 as viewed in FIG. 7 are established to control the mutual capacitance between the two conductors. If all conductors which are insulated have values of coaxial capacitance and DOD such that their coordinate values fall within the operating window 81, the difference in capacitance unbalance-to-ground values of any two conductors when twisted together will be acceptable. An operating window 82 with narrow tolerances and defined in part by spaced lines 56—56 of constant weight of insulation is also shown in FIG. 7 and insures not only that the maximum unbalance is not exceeded but also that the average unbalance is acceptable.

A second approach which while being somewhat less stringent on the manufacturing requirements requires an inventory control system. Each insulated conductor 23 is required to have insulation characteristics such that its coaxial capacitance and DOD fall within the larger rectangular operating window 54 and not necessarily within the precisely defined operating window 81 or 82. Hence, the requirements on operating parameters are relaxed somewhat over the preferred system. Each conductor reel is identified with a capacitance unbalance-to-ground value between it and the reference conductor having the preselected nominal values of coaxial capacitance and outside diameter and at twisting, an operator uses an inventory control system to insure that any two conductors which are twisted together have a minimum difference in capacitance-to-ground. This precaution need not be taken in the preferred system in which any two conductors which pass the operating window test necessarily will have an acceptable capacitance unbalance-to-ground value when twisted together.

It should be understood that the control exercised by practicing the principles of this invention is a two fold control. Not only is the maximum capacitance unbalance-to-ground value controlled to be within acceptable limits, but also the average capacitance unbalance-to-ground, which has a lower value than the maximum. This is especially important in the use of insulation such as HDPE where the maximum unbalance is not great but where if unchecked, the average is intolerable.

Figure 8:
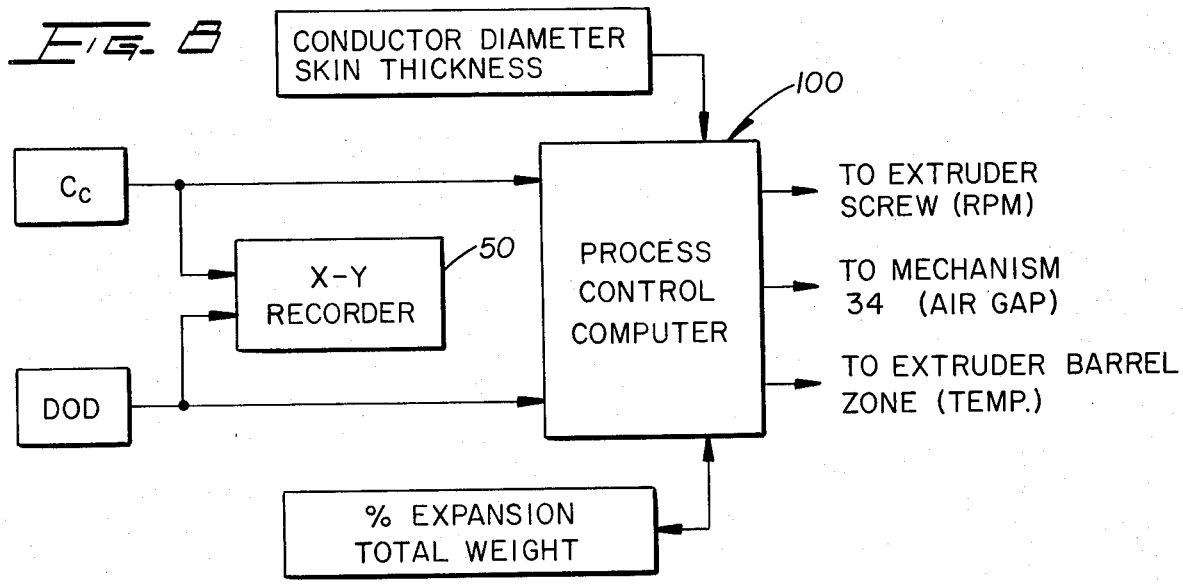
FIG. 8 is a schematic view of a feedback control system for the apparatus of FIG. 4.

Referring now to FIG. 8, it is seen how the principles of this invention may be extended to a feedback control system to automatically control process variables. As before, the coaxial capacitance and the DOD are measured by the capacitance monitor 36 and the gauge 37, respectively. The measurements are supplied as inputs to the x-y recorder 50 and as inputs to a process control computer, designated generally by the numeral 100. The inputs to the computer 100 which are proportional to the deviation from the nominal values as determined by process specifications cause built-in logic of the computer 100 to establish required correctional signals. These correctional signals are used to vary, for example, the extruder screw speed or to control the mechanism 34 to move the cooling trough 33 and adjust the air gap.

The process control computer 100 includes a built-in coordinate plotter which may be in terms of a Cartesian or other convenient coordinate system. In this way, a trace of coaxial capacitance and DOD is reviewed with respect to lines of constant percent expansion, lines of constant insulation weight, and lines of constant capacitance unbalance-to-ground which are programmed into the computer by using the equations referred to hereinbefore. Once the range widths for the capacitance unbalance-to-ground values are set, measurements which are determined to correspond to coaxial capacitance values outside the range cause the computer to control the apparatus 30 to adjust these variables which will change the percent expansion and insulation weight per foot and hence change the coaxial capacitance and DOD. The use of the x–y chart-recording instrument 50 in conjunction with the process control computer 100 permits an operator to observe visually the process conditions and correctional moves made by the computer 100.

It is to be understood that the above-described arrangements are simply illustrative of the invention. Other arrangements may be devised by those skilled in the art which will embody the principles of the invention and fall within the spirit and scope thereof.

What is claimed is:

1. A method of controlling capacitance unbalance-to-ground between conductors, which comprises the steps of:
   covering individual conductors with a plastic insulating material to form insulated conductors;
   measuring coaxial capacitance and outside diameter of each of the conductors;
   generating electrical signals corresponding to the measured coaxial capacitance and outside diameter of each insulated conductor and relating these signals to capacitance unbalance-to-ground between each said conductor and a reference insulated conductor having preselected values of coaxial capacitance and outside diameter; and
   controlling the process of covering of each conductor to maintain the capacitance unbalance-to-ground between each said conductor and the reference conductor within a predetermined range of values.

2. A method of controlling capacitance unbalance-to-ground in twisted pairs of insulated conductors, which includes the steps of:
   covering individual conductors with at least a layer of cellular insulation to form insulated conductors;
   measuring coaxial capacitance and outside diameter of each insulated conductor;
   relating the measured capacitance and outside diameter of each said insulated conductor to capacitance unbalance-to-ground between each said insulated conductor and a reference insulated conductor having preselected values of coaxial capacitance and outside diameter; and
   twisting together conductors which have a substantially negligible capacitance unbalance-to-ground therebetween.

3. The method of claim 2, wherein the covering of each of said individual conductors with at least a layer of cellular insulation is controlled to maintain the coaxial capacitance and outside diameter within ranges defined by predetermined values of capacitance unbalance-to-ground between said insulated conductor and the reference conductor and the twisting includes twisting together conductors each having coaxial capacitance and outside diameter which fall within said ranges.

4. The method of claim 3, which also includes:
   displaying the measured coaxial capacitance and outside diameter as coordinate values on a graph of coaxial capacitance and outside diameter wherein the relating step includes superimposing lines of constant capacitance unbalance-to-ground as between an insulated conductor and the reference conductor on said graph; and
   defining a region of the graph between selected ones of its lines of constant capacitance unbalance-to-ground;
   the twisting being accomplished so as to pair conductors having measured coaxial capacitance and diameter which fall within said region.

5. The method of claim 4, which also includes:
   superimposing on said graph lines of constant mutual capacitance which are related to the coaxial capacitance and outside diameter;
   the region being further defined between lines of constant mutual capacitance.

6. An apparatus for controlling capacitance unbalance-to-ground between conductors of a pair, which comprises:
   means for covering individual conductors with a plastic insulating material to form insulated conductors;
   means for measuring coaxial capacitance and outside diameter of each of the conductors;
   means for generating electrical signals related to the measured coaxial capacitance and outside diameter of each insulated conductor and for relating these signals to capacitance unbalance-to-ground between each said conductor and a reference insulated conductor having preselected values of coaxial capacitance and outside diameter; and
   means for controlling the covering of each conductor to maintain the capacitance unbalance-to-ground between each said conductor and the reference conductor within a predetermined range of values.

7. An apparatus for controlling capacitance unbalance-to-ground between insulated conductors which are twisted together, which includes:
   means for covering conductors with at least a layer of cellular insulation;
   means for measuring coaxial capacitance and outside diameter of each of the insulated conductors;
   means for defining values of constant capacitance unbalance-to-ground between an insulated conductor and a reference conductor having preselected values of coaxial capacitance and outside diameter in terms of the measured coaxial capacitance and diameter of the insulated conductor;
   means for comparing the capacitance unbalance-to-ground between each said insulated conductor and the reference conductor with the defined values;
   means responsive to the comparing means for controlling the coaxial capacitance and outside diameter of each insulated conductor to be within a predetermined range; and
   means for twisting together conductors having measured coaxial capacitance and diameter which fall within the predetermined range to cause the difference in the capacitance-to-ground therebetween to be acceptable.

8. An apparatus for controlling capacitance unbalance in twisted pairs of insulated conductors, which includes:

means for covering individual conductors with at least a layer of cellular insulation to form an insulated conductor;

means for measuring coaxial capacitance and outside diameter of each insulated conductor;

means for displaying the measured coaxial capacitance and outside diameter as coordinate values on a graph of coaxial capacitance and diameter;

means for superimposing on said graph lines of constant capacitance unbalance-to-ground between an insulated conductor and a reference insulated conductor having preselected values of coaxial capacitance and outside diameter and which are related to the measured coaxial capacitance and to the outside diameter of each insulated conductor;

means for defining a region of the graph as between selected ones of its lines of constant capacitance unbalance-to-ground;

means for controlling the covering of the conductors to maintain the coaxial capacitance and outside diameter of each insulated conductor to be within the region to maintain capacitance unbalance-to-ground of a twisted pair comprised of any of the conductors within an acceptable range of values; and means for twisting together conductors having measured coaxial capacitance and diameter which fall within said region to produce a twisted pair of insulated conductors having an acceptable capacitance unbalance-to-ground value.

* * * * *